(12) United States Patent
Aoki et al.

(10) Patent No.: US 6,524,376 B2
(45) Date of Patent: Feb. 25, 2003

(54) ANTICORROSIVE AGENT

(75) Inventors: Hidemitsu Aoki, Tokyo (JP); Tatsuya Koito, Tokyo (JP); Kenichi Nakabeppu, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/769,545

(22) Filed: Jan. 25, 2001

(65) Prior Publication Data

US 2001/0011515 A1 Aug. 9, 2001

(30) Foreign Application Priority Data

Jan. 25, 2000 (JP) ........................................ 2000-015602

(51) Int. Cl.⁷ .......................... C09K 13/02; C23F 11/00
(52) U.S. Cl. ................ 106/14.42; 106/14.41; 106/14.43; 106/14.44; 252/79.1; 252/394; 438/692
(58) Field of Search ............... 106/14.41, 14.42, 106/14.43, 14.44, 3; 252/79.1, 394; 438/692

(56) References Cited

U.S. PATENT DOCUMENTS 4,101,339 A * 7/1978 Kaneko et al. ................ 134/2
4,180,406 A * 12/1979 Miyazaki et al. ......... 106/14.15
4,457,790 A * 7/1984 Lindert et al. ........... 106/14.11

FOREIGN PATENT DOCUMENTS

| JP | 49-3832 | * | 1/1974 | |
| JP | 60-251287 | * | 12/1985 | |
| JP | 8-83780 | | 3/1996 | ......... H01L/21/304 |
| JP | 8-334905 | | 12/1996 | ............. G03F/7/42 |
| JP | 10-116804 | | 5/1998 | ......... H01L/21/304 |
| JP | 10-265979 | | 10/1998 | ........... C23F/11/00 |
| JP | 11-238709 | | 8/1999 | ......... H01L/21/304 |

OTHER PUBLICATIONS

Chemical Abstract No. 71:73462, abstract of an article by Gusev et al entitled "Protection of Copper wire from corrosion during annealing", Tr., Mosk. Inst. Nar. Khoz. (1968) No. 46, pp. 82–91 (no month recited).*

* cited by examiner

*Primary Examiner*—Anthony J. Green
(74) *Attorney, Agent, or Firm*—Hayes Soloway P.C.

(57) ABSTRACT

An anticorrosive agent containing, as essential components, (a) urea or a urea derivative and (b) a hydroxy aromatic compound.

5 Claims, 11 Drawing Sheets

AMINE CONCENTRATION : 60%
GALLIC ACID CONCENTRATION : 5%

—●— MONOETHANOLAMINE-CONTAINING SOLUTION
—○— N-METHYLETHANOLAMINE-CONTAINING SOLUTION ial
ANTICORROSIVE AGENT

BACKGROUND OF THE INVENTION

1. Field of the Invention

The present invention relates to an anticorrosive agent capable of preventing a corrodible metal such as copper or the like from being corroded.

2. Description of the Related Art

In the process for producing a semiconductor device, a metal film of particular pattern is formed on a semiconductor wafer to form wirings and contact plugs. In such a step for formation of wirings and contact plugs, a corrosion inhibition technique is important in order to prevent the metal film from being corroded, for prevention of, for example, an increase in resistance. In recent years, copper, in particular, has come to be used widely as a material constituting the wirings and contact plugs, in order to make semiconductor devices operable at a high speed; therefore, the corrosion inhibitability requirement for the metal film has become stronger. It is because copper easily undergoes oxidation, etc. and tends to corrode although copper has such advantages as excellent electromigration resistance and low resistance.

As an example of the process in which corrosion inhibition for metal film is important, there can be mentioned a peeling step using a resist-stripper solution. When through holes are formed on metal wirings, a step is necessary which comprises forming holes by dry etching and then peeling and removing the residue of resist and the residue of etching. In this case, it is important to prevent the metal wirings from being corroded by the stripper solution used. Hence, it is widely conducted to allow the resist-stripper solution to contain an anticorrosive agent and thereby prevent the metal wirings from being corroded. As such an anticorrosive agent, there have heretofore been used aromatic hydroxy compounds such as catechol, pyrogallol, hydroxybenzoic acid and the like; carboxyl group-containing organic compounds such as acetic acid, citric acid, succinic acid and the like; and benztriazole (BTA) (e.g. JP-A-8-334905).

In the chemical mechanical polishing (CMP) conducted when the metal wirings are copper wirings, corrosion inhibition for copper is important not only for the prevention of quality deterioration of wiring copper due to corrosion but also for an operational reason. In the case of copper wirings, since fine processing by dry etching is difficult, patterning of wirings is ordinarily conducted by a so-called damascene process (FIG. 3). In the damascene process, first, wiring grooves are formed in an insulating film 3 [FIG. 3(a)], after which a barrier metal film 4 is formed on the whole surface of the resulting material. Then, thereon is formed a copper film 5 so as to fill the wiring grooves. Thereafter, chemical mechanical polishing (hereinafter referred to as CMP) is conducted to remove the copper film 5 at the areas other than the wiring grooves. Thus, copper wirings filled in the wiring grooves are formed. In CMP, since a corrosive slurry is used, copper corrosion easily proceeds; therefore, corrosion inhibition for copper becomes important. In CMP, there also arise other problems unique in CMP, such as (i) generation of dishing and erosion, (ii) generation of slit between copper film and barrier metal film and (iii) sticking of copper (polished by CMP) to polishing pad and wafer. To prevent these problems, corrosion inhibition for copper becomes important also. Description is made below on these problems.

Dishing refers to a phenomenon as shown in FIG. 4 that the surface of a copper film 5 is dented at the center. This is caused by a fact that the polishing rate of the copper film 5 is far larger than the polishing rate of a barrier metal film 4. Generation of dishing gives rise to various problems, for example, reduction in sectional area of wiring and resultant local increase in resistance.

Erosion refers to a phenomenon as shown in FIG. 3(c) that CMP proceeds excessively at a region of densely arranged wirings and the surface of the region is dented. Generation of erosion gives rise to an increase in wiring resistance and deteriorates the flatness of substrate surface, causing, for example, short-circuiting of wirings.

Slit between copper film and barrier metal film refers to a slit as shown in FIG. 4, generated by a kind of battery action during CMP. Generation of slit gives rise to an increase in wiring resistance and makes later film formation insufficient.

Sticking of copper (polished by CMP) to wafer, etc. refers to a phenomenon that copper ions generated during CMP accumulate on a polishing pad, then restick onto the wafer, whereby the flatness of wafer surface is deteriorated and short-circuiting is incurred. This problem is described in, for example, JP-A-10-116804.

Thus, corrosion inhibition for metal is necessary in CMP for prevention of the quality deterioration of wiring metal caused by corrosion and also for the operational reason. In conventional CMP, an anticorrosive agent has been used for the main reasons of prevention of dishing and prevention of sticking of copper to polishing pad, and benztriazole or a derivative thereof has been used (JP-A-8-83780 and JP-A-11-238709).

In the above, corrosion inhibition in production of semiconductor device has been stated. In other technical fields as well, various studies have been made on anticorrosive agents capable of appropriately preventing corrodible metals from being corroded. For example, JP-A-10-265979 discloses a technique of using BTA, etc. as an anticorrosive agent for preventing a copper material (e.g. copper wire or twisted copper wire) from being corroded.

SUMMARY OF THE INVENTION

As mentioned above, BTA and derivatives thereof all having relatively high corrosion inhibitability are in general use as an anticorrosive agent for corrodible metals (e.g. copper). BTA and derivatives thereof, however, have had a problem in that they are difficult to decompose by using biological organisms and the disposal of the waste liquid generated is difficult.

In recent years, the requirement for low environmental load has become increasingly strong and the safety requirement for waste liquid from plant has become higher. Waste liquids from plants are ordinarily decomposed by biological treatment (hereinafter referred to as "biodegradation treatment"). The above-mentioned BTA and derivatives thereof are difficult to subject to biodegradation treatment.

Therefore, in using an anticorrosive agent containing BTA or a derivative thereof, the waste liquid generated therefrom has inevitably been disposed by a method other than the biodegradation treatment, requiring a higher cost and more labor.

Meanwhile, in the field of resist-stripper solution, aromatic hydroxy compounds, carboxyl group-containing organic compounds, etc. have been used as an anticorrosive agent in some cases, as mentioned previously. These anticorrosive agents are generally superior in biodegradability to BTA and derivatives thereof; however, since they are intended for corrosion inhibition for mainly a wiring material made of an aluminum-copper alloy, they have no sufficient corrosion inhibitability for highly corrodible metals (e.g. copper) and have been difficult to use as an anticorrosive agent functioning under severe conditions such as CMP.

In view of the above situation, the present invention aims at providing an anticorrosive agent which has high corrosion inhibitability capable of effectively preventing a corrodible metal such as copper or the like from being corroded and also has good decomposability by biological organisms.

In developing an anticorrosive agent, how to allow the anticorrosive agent to have high corrosion inhibitability for metals has been an important technical task. In order to allow an anticorrosive agent to have biodegradability in addition to the corrosion inhibitability for metals, a study must be made from a standpoint different from conventional standpoints. The present inventors made a study from such a standpoint and found out that both high corrosion inhibitability and excellent biodegradability can be achieved by using an anticorrosive agent containing a combination of two kinds of compounds. The present invention has been completed based on the above finding.

According to the present invention, there is provided an anticorrosive agent containing, as essential components, (a) urea or an urea derivative and (b) a hydroxy aromatic compound.

According to the present invention, there is also provided an anticorrosive solution obtained by dissolving the above anticorrosive agent in water or an organic solvent.

According to the present invention, there is also provided an anticorrosive treating solution for corrosion inhibition treatment for a semiconductor wafer having the exposed surface of a metal film, which contains the above anticorrosive agent.

According to the present invention, there is also provided a preservative solution for storage of a semiconductor wafer having the exposed surface of a metal film, which contains the above anticorrosive agent.

According to the present invention, there is also provided a slurry for chemical mechanical polishing of the surface of a semiconductor wafer having the exposed surface of a metal film, which contains the above anticorrosive agent.

Hydroxy aromatic compounds have heretofore been used as an anticorrosive agent for aluminum alloy film in the field of resist-stripper solution. However, these hydroxy aromatic compounds show insufficient corrosion inhibition effect to corrodible metals such as copper when used by themselves. By using a hydroxy aromatic compound in combination with urea or an urea derivative, there is obtained an excellent corrosion inhibition action which is not obtainable only with either a hydroxy aromatic compound or urea or its derivative. There was a case (JP-A-11-21546) of using urea or an urea derivative as an oxidizing agent in the form of urea-hydrogen peroxide in, for example, a slurry for chemical mechanical polishing (hereinafter referred to as "CMP slurry"); however, there was no case of using as an anticorrosive agent. By combining a hydroxy aromatic compound with urea or an urea derivative, however, there is obtained a striking corrosion inhibition effect which has been unobtainable with conventional arts.

The reason therefor is not clear but is presumed to be as follows. A hydroxy aromatic compound is adsorbed on the surface of a metal (e.g. copper) film via the hydroxyl group or the like. At this time, the aromatic ring (which is hydrophobic) is at an exterior site; therefore, the metal surface becomes hydrophobic; as a result, copper is prevented from being corroded. Only with this hydroxy aromatic compound, however, it is difficult to cover all the metal surface sufficiently and densely. Meanwhile, urea or a urea derivative (hereinafter referred to as "urea type compound" as necessary) has, in the molecule, two nitrogen atoms showing an chelating action to a metal film and moreover has a relatively low molecular weight; therefore, is strongly adsorbed on the metal surface to form a dense coating layer. Moreover, since having high solubility in water, the urea type compound can be used in a large amount in an aqueous anticorrosive solution. Therefore, when a hydroxy aromatic compound and a urea type compound are used in combination, they act toward a metal film surface so as to supplement each other, and impart hydrophobicity to a metal surface and form a dense coating layer. As a result, an excellent corrosion inhibition action which has been unobtainable heretofore, can be obtained.

In addition, the anticorrosive agent of the present invention has very high biodegradability, and a waste liquid thereof can be disposed easily. Each urea type compound has a structure similar to those of urea, etc. (existing as a natural product in nature) and is very easily decomposed by biological organisms. Each hydroxy aromatic compound had good biodegradability as well. Therefore, the anticorrosive agent of the present invention has good biodegradability.

DETAILED DESCRIPTION OF THE PREFFERED EMBODYMENTS

Figure 1A:
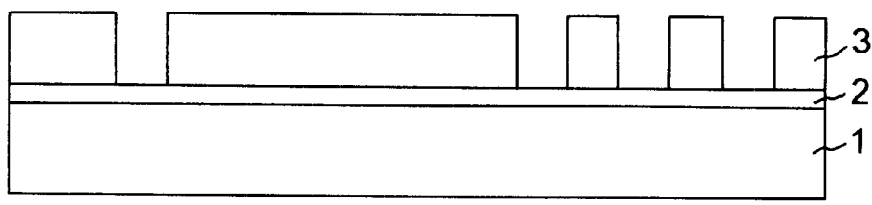
FIGS. 1A to 1D show sectional views for explaining the steps for forming copper wirings by a damascene process.

The component (a) of the present invention is urea or an urea derivative. As specific examples of the component (a), there can be mentioned urea, 1,1-dimethylurea, 1,3-dimethylurea, 1,1,3-trimethylurea, 1,1,3,3- tetramethylurea, thiourea, 1,1-dimethylthiourea, 1,3-dimethylthiourea, 1,1,3-trimethylthiourea, 1,1,3,3-tetramethylthiourea, ethyleneurea and ethylenethiourea. At least one kind of these compounds can be selected.

The component (a) of the present invention is preferably a compound represented by the following general formula (1):

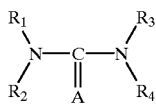

(1)

($R_1$, $R_2$, $R_3$ and $R_4$ are each independently a hydrogen atom or an alkyl group having 1 to 3 carbon atoms; and A is an oxygen atom or a sulfur atom). The urea type compound having the above structure shows very good corrosion inhibitability because it forms a strong and dense coating layer on the surface of a metal. Moreover, the urea type compound has excellent biodegradability because it has a structure similar to that of urea existing in nature. Of the compounds of the above structure, urea can be used particularly preferably because it has a low molecular weight, high solubility in water and, therefore, very high biodegradability and also because it can show higher corrosion inhibitability at an increased concentration in aqueous solution.

The component (b) of the present invention is a hydroxy aromatic compound. As specific examples of the hydroxy aromatic compound, there can be mentioned phenol, cresol, xylenol, p-aminophenol, m-aminophenol, diaminophenol, p-hydroxybenzoic acid, o-hydroxybenzoic acid, catechol, resorcinol, hydroquinone, salicylic alcohol, p-hydroxybenzyl alcohol, o-hydroxybenzyl alcohol, p-hydroxyphenethyl alcohol, 2,4-dihydroxybenzoic acid, 2,5-dihydroxybenzoic acid, 3,4-dihydroxybenzoic acid, 3,5-dihydroxybenzoic acid, pyrogallol, hydroxyhydroquinone, fluoroglucinol, gallic acid and tannic acid. The methyl esters and ethyl esters of the above benzoic acids, gallic acid and tannic acid can also be used. These compounds can be used singly or in combination of two or more kinds.

Of these, a benzene derivative having, in the molecule, at least two phenolic hydroxyl groups is selected preferably. Such a compound is easily adsorbed on a metal, and is highly soluble in water and therefore can be used in a large amount in an aqueous solution; as a result, can show good corrosion inhibitability. As examples of the benzene derivative having at least two phenolic hydroxyl groups in the molecule, there can be mentioned catechol, resorcinol, hydroquinone, pyrogallol, hydroxyhydroquinone, fluoroglucinol, gallic acid and tannic acid. Of these, preferred are pyrogallol, hydroxyhydroquinone, fluoroglucinol, gallic acid and tannic acid; particularly preferred are gallic acid and pyrogallol. It is because they show particularly high corrosion inhibitability and biodegradability. These compounds may be used singly or in combination of two or more kinds.

In the anticorrosive agent, the mixing ratio of the component (a) and the component (b) can be set as desired. However, the amount of the component (b) is, for example, preferably 1 to 200% by mass, more preferably 10 to 100% by mass relative to 100% by mass of the component (a). By using such a mixing ratio, the components (a) and (b) act synergistically and a more striking corrosion inhibition effect is obtained.

The anticorrosive agent of the present invention is particularly effective when used for corrosion inhibition of copper or a copper alloy containing copper as a main component. A copper alloy containing copper as a main component refers to an alloy containing copper in an amount of 90% by mass or more, and is a copper alloy containing a conductive metal(s) such as silver, gold, platinum, titanium, tungsten, aluminum or (and) the like.

The anticorrosive solution according to the present invention is obtained by dissolving the above anticorrosive agent containing the (a) and (b) as essential components, in water or an organic solvent. Since the above anticorrosive agent is highly soluble in water, the anticorrosive solution is preferably a solution in water or a water/hydrophilic organic solvent mixture. When the anticorrosive solution is such a solution, the components (a) and (b) act synergistically and a more striking corrosion inhibition effect is obtained. In the anticorrosive solution of the present invention, the concentrations of the components (a) and (b) can be set appropriately depending upon the application and purpose of the anticorrosive solution; however, the concentrations are determined preferably as follows, for example. That is, the lower limit of the component (a) is preferably 0.001% by mass, particularly preferably 0.01% by mass. There is no particular restriction as to the upper limit, but the upper limit is, for example, about 60% by mass in view of the solubility in water or the like. Meanwhile, the upper limit of the component (b) is preferably 20% by mass, particularly preferably 10% by mass. The lower limit is preferably 0.0001% by mass, particularly preferably 0.001% by mass. By employing such amounts, very good corrosion inhibitability can be obtained.

As the preferable application of the anticorrosive agent of the present invention, there can be mentioned corrosion inhibition of a metal film (particularly a copper film) formed on a semiconductor wafer. When the present anticorrosive agent is applied to, for example, a slurry for CMP, an anticorrosive treating solution, a preservative solution for wafer, or a stripper solution for resist, etc. (these solutions are used after CMP), the effects of the present invention can be exhibited more strikingly.

The present invention is very effective when applied to the CMP process for a semiconductor wafer having an exposed metal film, particularly an exposed copper film. The CMP process uses a slurry corrosive to metals and therefore tends to promote metal corrosion; moreover, has problems unique to CMP process, such as (i) generation of dishing and erosion, (ii) generation of slit between metal film and barrier metal film and (iii) sticking of metal polished by CMP, to polishing pad or wafer. With the anticorrosive agent of the present invention, a dense protective layer is formed on a metal film and moreover the surface of the resulting metal film has appropriate hydrophobicity; therefore, the above problems can be solved effectively. Description is made below on the application of the present anticorrosive agent to CMP process.

The process for formation of copper wirings by using CMP is conducted according to the steps shown in FIG. 1. First, as shown in FIG. 1(a), on a silicon wafer (not shown) are formed a silicon oxide film 1, a silicon nitride film 2 and a silicon oxide film 3 in this order; then, dry etching is conducted to form a plurality of wiring grooves having a desired pattern. Next, as shown in FIG. 1(b), on the whole surface of the resulting material is formed a barrier metal film 4 by sputtering. As the material for the barrier metal film, there can be used Ta, TaN, Ti, TiN, W, WN, WSiN, etc. The film thickness is ordinarily set at about 10 to 100 nm. Successively, a copper film 5 is formed on the barrier metal film 4 [FIG. 1(b)]. For formation of the copper film 5, there can be used plating, CVD, sputtering or the like.

Next, the surface of the copper film 5 is polished by CMP. CMP is conducted ordinarily by using a slurry containing an oxidizing agent and abrasive grains as main components, and by etching the copper surface by the chemical action of the oxidizing agent and removing the oxidized surface layer by the mechanical action of the abrasive grains. By allowing the above CMP slurry to contain the anticorrosive agent of the present invention, it is possible to prevent the corrosion of copper during CMP and further suppress the polishing rate of copper to prevent dishing. Moreover, although the CMP process produces a large amount of a waste liquid, the disposal of the waste liquid is easy because the anticorrosive agent of the present invention has good biodegradability.

Figure 1B:
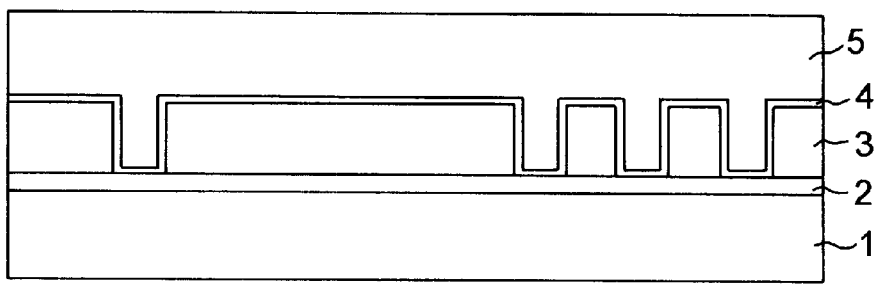
Figure 1C:
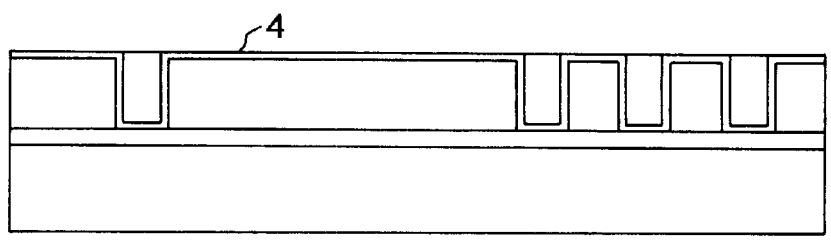
Figure 1D:
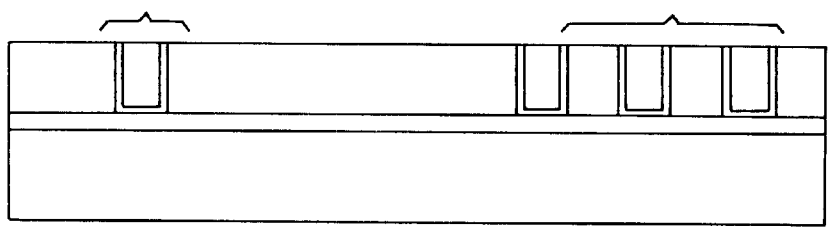

CMP is conducted until, as shown in FIG. 1(d), the barrier metal film 4 is removed completely. In CMP, a single slurry may be used, but two or more kinds of slurries may be used for prevention of dishing and erosion. For example, two kinds of slurries, i.e. a slurry for metal polishing and a slurry for polishing of oxide film and barrier metal film may be used. When the anticorrosive agent of the present invention is applied to a CMP slurry, the addition may be made to any slurry of various stages; however, the addition to a slurry after the exposure of the barrier metal film shown in FIG. 1(c) is particularly effective. By such addition, the corrosion inhibition of the copper film 5 constituting wirings and the suppression of dishing and erosion become very striking.

CMP is complete when the barrier metal film 4 is removed and a change in torque is seen [FIG. 1(d)]. Then, post-cleaning is conducted as necessary, and rinsing is conducted using a rinsing solution containing pure water as a main component, whereby a process for formation of copper wirings is completed.

Figure 2:
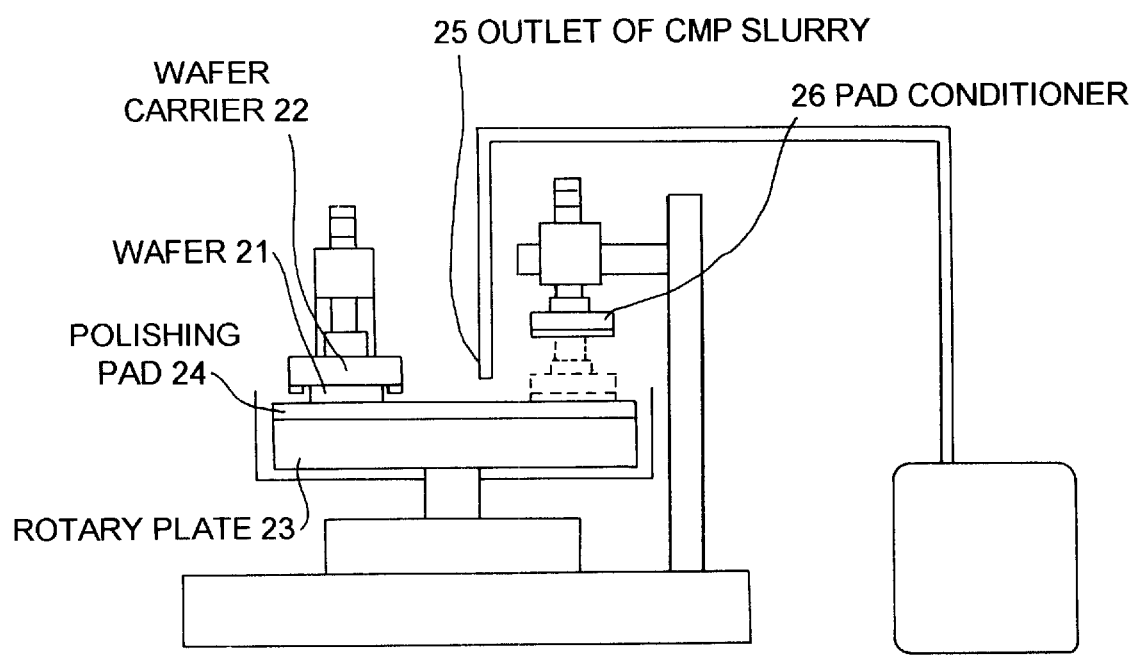
FIG. 2 is a schematic drawing showing the constitution of an apparatus for chemical mechanical polishing.
Figure 3A:
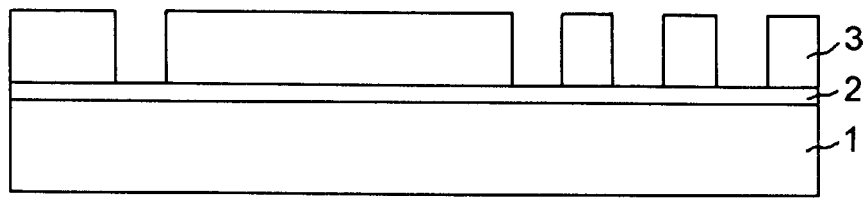
FIGS. 3A to 3D show sectional views for explaining the steps for forming copper wirings by a damascene process.
Figure 3B:
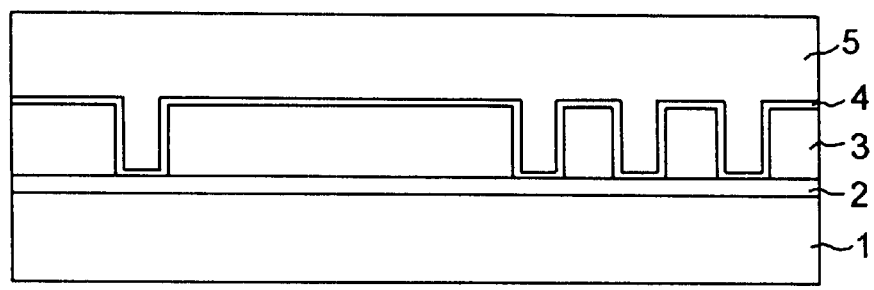
Figure 3C:
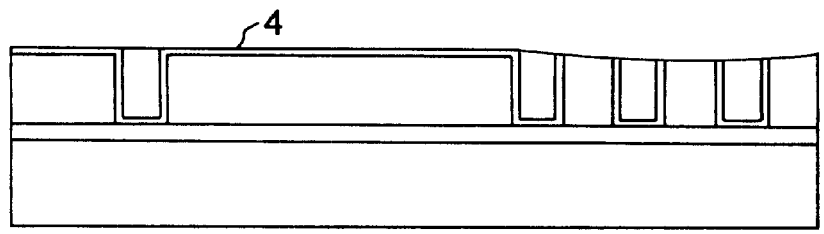
Figure 3D:
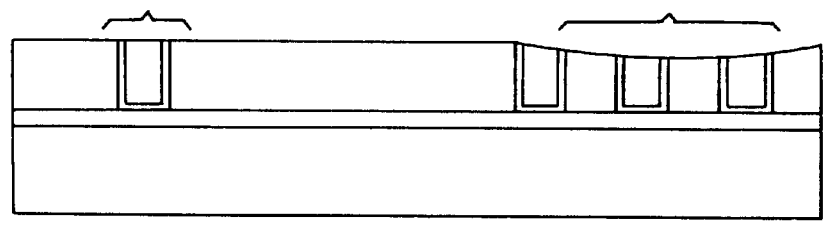
Figure 4:
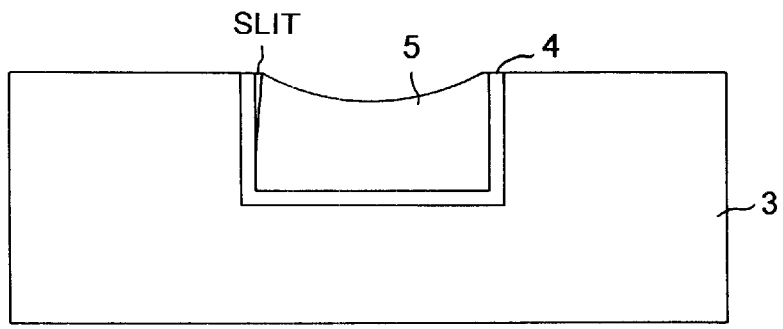
FIG. 4 is a drawing showing the section of a copper wiring having dishing and a slit.

CMP can be conducted using an apparatus for chemical mechanical polishing, such as shown in FIG. 2. A wafer 21 having thereon an insulting film, a copper type metal film, etc. is mounted on a wafer carrier 22 on a spindle. The surface of this wafer 21 is contacted with a polishing pad 24 attached onto a rotary plate (a platen) 23, and both the wafer 21 and the polishing pad 24 are rotated while a CMP slurry is fed onto the polishing pad 24 from an outlet 25 of CMP slurry. As necessary, a pad conditioner 26 is contacted with the surface of the polishing pad 24, to conduct the conditioning of the polishing pad surface. Incidentally, the CMP slurry may be fed onto the surface of the polishing pad 24 from the direction of the rotary plate 23.

Figure 5:
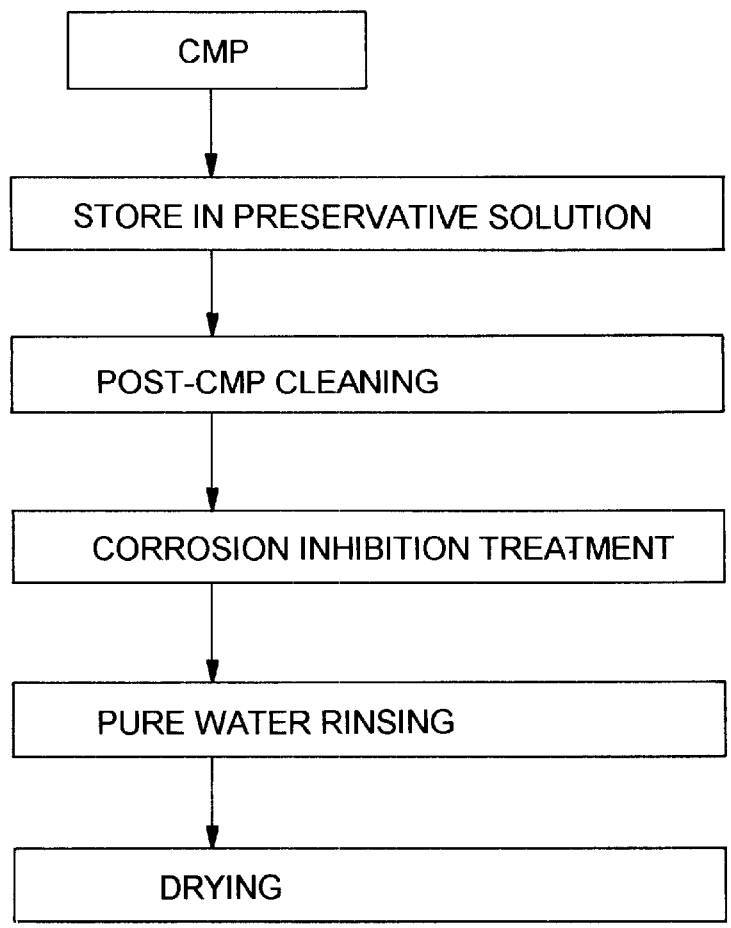
FIG. 5 is a drawing for explaining the steps after CMP.

The present invention may be applied also to a post-treatment after CMP. An example of the post-treatment after CMP is shown in FIG. 5. After CMP, a wafer is stored once in a preservative solution; then, post-CMP cleaning is conducted to remove the particles generated by polishing, etc.; then, a corrosion inhibition treatment is conducted as necessary using an anticorrosive treating solution; lastly, rinsing is conducted using a rinsing solution containing pure water as a main component. In this post-treatment after CMP, when the anticorrosive agent of the present invention is added to the preservative solution, the anticorrosive treating solution and/or the rinsing solution, the copper film formed on wafer can be advantageously protected from corrosion with no difficulty in disposal of waste liquid.

Figure 6:
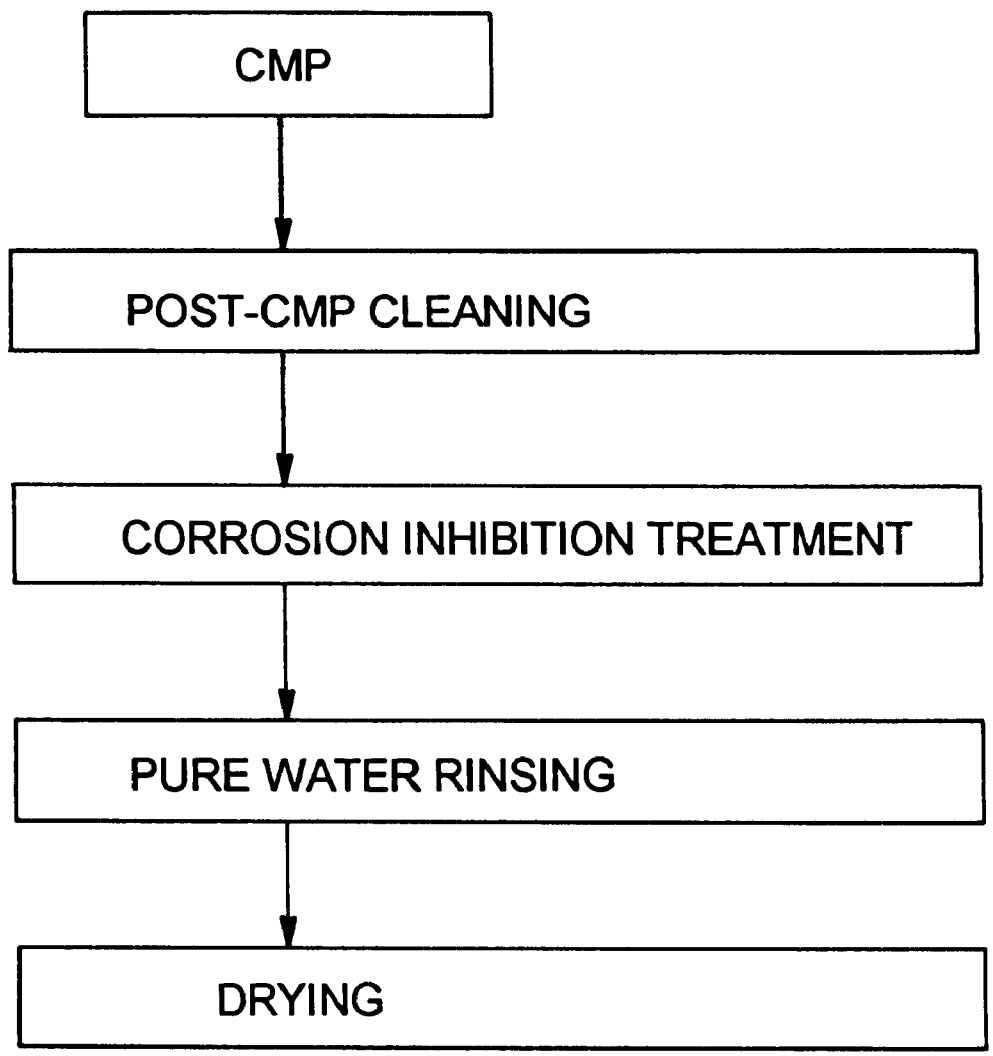
FIG. 6 is a drawing for explaining the steps after CMP.

When CMP and the post-treatment after CMP are conducted in one operational line, they are conducted in a flow such as shown in FIG. 6. In this case, use of the present anticorrosive agent in the corrosion inhibition treatment is effective.

Next, description is made on preferred embodiments of the slurry, for chemical mechanical polishing, preservative solution and anticorrosive treating solution of the present invention.

The slurry for chemical mechanical polishing of the present invention contains the above-mentioned anticorrosive agent according to the present invention. The content of the anticorrosive agent is preferably 0.01% by mass or more, more preferably 0.1% by mass or more relative to the total amount of the slurry, for obtaining a sufficient corrosion inhibition effect. For adjustment to an appropriate polishing rate, the content is preferably 30% by mass or less, more preferably 20% by mass or less. When the content is too high, the corrosion inhibition effect obtained is too high, which may make the polishing rate of copper too small and may take a long time for CMP.

The slurry for chemical mechanical polishing of the present invention preferably contains, besides the anticorrosive agent, an abrasive an oxidizing agent and water. The slurry may further contain an organic acid, etc. as necessary.

As the abrasive, there can be used alumina (e.g. α-alumina, θ-alumina or δ-alumina), silica (e.g. fumed silica or colloidal silica), titania, zirconia, germania, ceria, and mixtures of two or more kinds selected from the group consisting of the above metal oxide abrasives.

The content of the abrasive in the CMP slurry is set appropriately in view of, for example, the efficiency or precision of polishing and is in a range of preferably 0.1to 50% by mass, more preferably 72 to 30% by mass relative to the total amount of the slurry composition.

The oxidizing agent can appropriately be selected from known water-soluble oxidizing agents in view of the kind of conductive metal film aged the precision or efficiency of polishing. For example, as the oxidizing agent giving rise to no contamination of heavy metal ion, there can be mentioned peroxides such as $H_2O_2$, $Na_2O_2$, $Ba_2O_2$, $(C_6H_5C)_2O_2$ and the like; hypochlorous acid (HClO); perchloric acid; nitric acid; ozone water; and organic peroxides such as peracetic acid, nitrobenzene and the like. Of these, preferred is hydrogen peroxide ($H_2O_2$) which contains no metal component and gives no harmful by-product. The amount of the oxidizing agent is preferably 0.01% by mass or more, more preferably 0.05% by mass or more relative to the total amount of the CMP slurry, for obtaining a sufficient addition effect. For suppression of dishing and adjustment to an appropriate polishing rate, the amount is preferably 15% by mass or less, more preferably 10% by mass or less. When there is used an oxidizing agent which is deteriorated relatively easily with time, such as hydrogen peroxide, it is possible to independently prepare a solution containing such an oxidizing agent in an appropriate concentration and a solution containing an abrasive, etc., and mix them to produce a polishing slurry, right before use of the slurry.

The organic acid is added for promoting the oxidation by the above oxidizing agent as well as for stable polishing. As the organic acid, there is used an organic acid capable of functioning as a proton donor. A carboxylic acid or an amino acid is used preferably.

As specific examples of the carboxylic acid, there can be mentioned formic acid, acetic acid, propionic acid, butyric acid, valeric acid, acrylic acid, lactic acid, succinic acid, nicotinic acid, oxalic acid, malonic acid, tartaric acid, malic acid, glutaric acid, citric acid, maleic acid, and salts thereof.

As specific examples of the amino acid, there can be mentioned L-glutamic acid, D-glutamic acid, L-glutamic acid monohydrochloride, sodium L-glutamate monohydrate, L-glutamine, glutathione, glycylglycine, DL-alanine, L-alanine, β-alanine, D-alanine, γ-alanine, γ-aminobutyric acid, ε-aminocaproic acid, L-alginine monohydrochloride, L-aspartic acid, L-aspartic acid monohydrate, potassium L-asparrate, calcium L-aspartate trihydrate, D-aspartic acid, L-tryptophane, L-threonine, L-alginine, glycine, L-cystine, L-cysteine, L-cysteine hydrochloride monohydrate, L-oxyproline, L-isoleucine, L-leucine, L-lysine monohydrochloride, DL-methionine, L-methionine, L-ornithine hydrochloride, L-phenylalanine, D-phenylglycine, L-proline, L-cerin, L-tyrosine and L-valine.

The content of the organic acid is preferably 0.01% by mass or more, more preferably 0.05% by mass or more relative to the total amount of the CMP slurry for obtaining a sufficient addition effect of proton donor. For suppression of dishing and adjustment to appropriate polishing rate, the content is preferably 5% by mass or less, more preferably 3% by mass or less.

The CMP slurry of the present invention may contain various ordinary additives widely used in CMP slurry, such as dispersing agent, buffer agent, viscosity-controlling agent and the like, as long as the properties of the slurry are not impaired.

The CMP slurry of the present invention can be produced by an ordinary method for producing a polishing slurry composition containing free abrasive grains. That is, an appropriate amount of abrasive particles are mixed into a dispersing agent. As necessary, an appropriate amount of a protective agent is added. In this state, the abrasive particles have poor wettability and are in a flocculated state, because air is strongly adsorbed on the surfaces of the abrasive particles. In order to convert the flocculated abrasive particles into primary particles, dispersion of particles is conducted. In the dispersion step, an ordinary dispersion method and an ordinary dispersion apparatus can be used. The dispersion can specifically be conducted by a known method using, for example, an ultrasonic dispersing machine, a beads mill dispersing machine, a kneader or a ball mill.

The preservative solution of the present invention is preferably an aqueous solution obtained by dissolving the anticorrosive agent of the present invention in water. The lower limit of the anticorrosive agent concentration in the preservative solution is preferably 0.001% by mass, more preferably 0.01% by mass. When the anticorrosive agent concentration is too low, no sufficient corrosion inhibition effect may be obtained. There is no particular restriction as to the upper limit of the anticorrosive agent concentration, and a sufficient corrosion inhibition effect is obtained even when the concentration is, for example, 30% by mass or less. There is no particular restriction as to the environment in which a semiconductor wafer is stored in the preservative solution. For example, in storing a semiconductor wafer after CMP, the storage is generally made in the same environment as that in which the apparatus used for CMP is placed. Incidentally, the preservative solution of the present invention can be used not only in storage after CMP but also in other various stages.

The anticorrosive treating solution of the present invention is preferably an aqueous solution obtained by dissolving the anticorrosive agent of the present invention in water, similarly to the above-mentioned preservative solution. This aqueous solution may as necessary contain other additives, a water-soluble organic solvent, etc. The lower limit the anticorrosive agent concentration in the anticorrosive treating solution is preferably 0.001% by mass, more preferably 0.01% by mass. When the anticorrosive agent concentration is too low, no sufficient corrosion inhibition effect may be obtained. There is no particular restriction as to the upper limit of the anticorrosive agent concentration, and a sufficient corrosion inhibition effect is obtained even when the concentration is, for example, 30% by mass or less. The anticorrosive treating solution of the present invention is applicable to the corrosion inhibition treatment stage of FIG. 5, but is also applicable to the pure water rinsing stage of FIG. 5. The anticorrosive treating solution used therein is preferably an aqueous solution obtained by dissolving the present anticorrosive agent in pure water in the above-mentioned concentration range. Incidentally, the anticorrosive treating solution of the present invention can be used not only in corrosion inhibition treatment after CMP but also in other various stages.

The above-mentioned CMP slurry, anticorrosive treating solution and preservative solution are used for the treatment of a semiconductor wafer having an exposed metal film surface. When the metal film is a copper film or a film of a copper alloy containing copper as a main component, the effects of the present invention are exhibited more strikingly.

To the preservative solution and anticorrosive treating solution of the present invention may as necessary be added additives, an organic solvent, etc. For example, an acid or a base may be added for pH adjustment, and an organic solvent miscible with water and other components used may be used for increasing the solubility of anticorrosive agent or for higher corrosion inhibitability.

As the above water-soluble organic solvent, there can be mentioned sulfoxides such as dimethyl sulfoxide and the like; sulfones such as dimethylsulfone, diethylsulfone, bis (2-hydroxyethyl)sulfone, tetramethylenesulfone and the like; amides such as N,N-dimethylformamide, N-methylformamide, N,N-dimethylacetamide, N-methylacetamide, N,N-diethylacetamide and the like; lactams such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone and the like; imidazolidinones such as 1,3-dimethyl-2-imidazolidinone, 1,3-diethyl-2-imidazolidinone, 1,3-diisopropyl-2-imidazolidinone and the like; lactones such as γ-butyrolactone, δ-valerolactone and the like; and polyhydric alcohols and derivatives thereof, such as ethylene glycol, ethylene glycol monomethyl ether, ethylene glycol monoethylether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether and the like. These compounds can be used singly or in combination of two or more kinds.

The anticorrosive agent of the present invention can also be applied to a stripper solution for resist or the like. The stripper solution preferably contains a peeling component such as hydroxylamine, alkanolamine, hydrofluoric acid salt or the like, and water.

Specific examples of the hydroxylamine include hydroxylamine (NH2OH), N-methylhydroxylamine, N,N-dimethylhydroxylamine and N,N-diethylhdyroxylamine.

Specific examples of the alkanolamine include monoethanolamine, diethanolamine, N-ethylaminoethanol, N-methylaminoethanol, dilethylaninoethanol and 2-(2-aminoethoxy)ethanol. Of these, monoethanolamine and N-methylaminoethanol are particularly preferred for the excellent stripping ability.

In the stripper solution, the upper limit of the amount of the peeling component is preferably 70% by mass, particularly preferably 60% by mass. The lower limit is preferably 5% by mass, particularly preferably 10% by mass. By containing the peeling component in such an amount, the stripper solution can remove resist film and etching residue very efficiently while maintaining good corrosion inhibitability.

In the stripper solution, the upper limit of the amount of water is preferably 40% by mass, particularly preferably 30% by mass. The lower limit is preferably 2% by mass, particularly preferably 5% by mass. By containing water in such an amount, the stripper solution can sufficiently exhibit the function of the peeling component, i.e. the hydroxylamine or alkanolamine, and the stripping ability and corrosion inhibitability of the stripper solution become very good.

The stripper solution using the anticorrosive agent of the present invention may contain a water-soluble organic solvent. The water-soluble organic solvent may be the same water-soluble organic solvent as mentioned previously. The upper limit of the amount of the water-soluble organic solvent is preferably 80% by mass, particularly preferably 70% by mass. The lower limit is preferably 5% by mass, particularly preferably 10% by mass. By containing the water-soluble organic solvent in such an amount, the stripper solution can have a very good balance between stripping ability and corrosion inhibitability.

The substances to be peeled by the above stripper solution are unnecessary substances remaining on the semiconductor substrate. The unnecessary substances on semiconductor substrate refer to various unnecessary substances generated during the process for production of semiconductor device, and include resist film, etching residue after dry etching, chemically modified resist film, etc. The above stripper solution is more effective particularly when the substances to be peeled are a resist film and/or an etching residue on a semiconductor substrate having an exposed surface of a metal film. The stripper solution exhibits the corrosion inhibition action of the present anticorrosive agent more effectively when the above metal film is a copper film.

The above stripper solution can be used for peeling of various resists. For example, it can be used for (i) a positive resist containing a naphthoquinone diazide compound and a novolac resin, (ii) a positive resist containing a compound capable of generating an acid upon light exposure, a compound which is decomposed by an acid and comes to have increased solubility in an aqueous alkali solution, and an alkali-soluble resin, (iii) a positive resist containing a compound capable of generating an acid upon light exposure, and an alkali-soluble resin having a group which is decomposed by an acid and comes to have increased solubility in an aqueous alkali solution, and (iv) a negative resist containing a compound capable of generating an acid upon light exposure, a crosslinking agent and an alkali-soluble resin.

Next, there is described, as an example of applying the stripper composition using the anticorrosive agent of the present invention, a case of forming an interconnection plug on a copper wiring by a single damascene process.

Figure 9A:
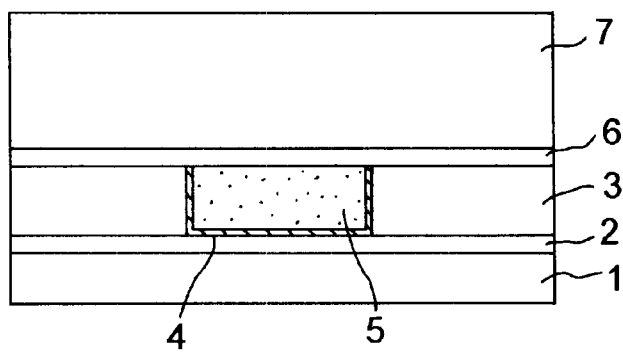
FIGS. 9A to 9C show sectional views for explaining the steps for forming a through hole.

First, as shown in FIG. 9(a), on a semiconductor substrate (not shown) having components such as transistors and the like are formed a silicon oxide film 1, a silicon nitride film 2 and a silicon oxide film 3; then, a barrier metal film 4 and a copper wiring consisting of a copper film 5 are formed by a known damascene process using chemical mechanical polishing (hereinafter referred to as CMP); thereon are formed a silicon nitride film 6 having a thickness of about 50 to 100 nm and a silicon oxide film 7 having a thickness of about 600 to 1,000 nm. The thickness of the copper film 5 can be determined as desired but is set preferably at, for example, 350 nm or less for lower parasitic capacity between neighboring wirings. When the thickness of the copper wiring is small, the thickness of the corroded copper layer is large relative to the total thickness of the copper wiring layer and an increase in the resistance of copper wiring caused by the corrosion of copper surface becomes a problem. However, use of the stripper composition containing the present anticorrosive agent can solve such a problem and makes possible a copper wiring having a small thickness. Incidentally, in the present example, the thickness of the silicon nitride film 6 is about 50 to 100 nm, but it may be made larger for higher etching preventability.

Figure 9B:
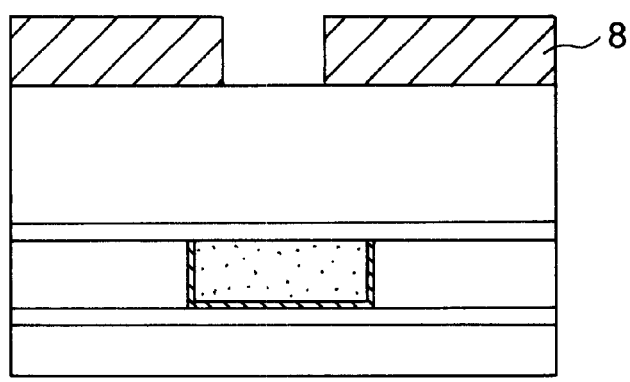

Next, on the silicon oxide film 7 is formed a resist film 8 having a desired pattern [FIG. 9(b)].

Figure 9C:
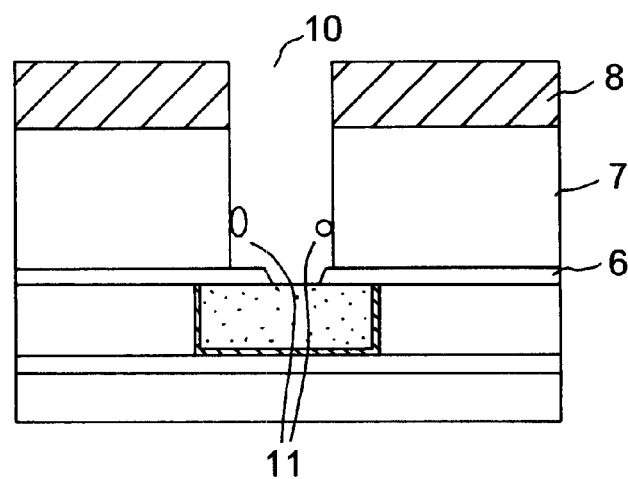

Next, the silicon oxide film 7 is dry-etched using the resist film 8 as a mask, until the silicon nitride film 6 is exposed [FIG. 9(c)]. At this time, an etching residue 11 sticks to the inner wall of a through hole 10. The diameter of the through hole is, for example, about 0.2 $\mu$m. As the etching gas, there is preferably used a gas which can etch the silicon oxide film faster than the silicon nitride film.

The silicon nitride film 6 has a function for prevention of copper diffusion and also a function for prevention of copper etching. However, as shown in FIG. 9(c), there arise cases that dry etching cannot be terminated on the silicon nitride film 6 as intended. This is for the following reason. Generally in a process such as the present example, through holes of various diameters are formed on a semiconductor wafer. In the through holes of small diameters, etching proceeds slowly owing to the microloading effect. Therefore, a certain longer time is needed for etching in order to form through holes. Thereby, the silicon nitride film 6 is etched in some throughholes, allowing part of the copper film 5 to be exposed. Also, when, for example, a dent called dishing is generated on the copper film 5, the silicon nitride film 6 comes to have a thin film portion; this portion of the silicon nitride film 6 is etched and part of the copper film 5 may be exposed. Exposure of the copper film 5 can be prevented if the silicon nitride film 6 is formed in a large thickness in the step of FIG. 9(a); however, if it is done, the capacity between neighboring copper wirings becomes large and the high-speed operation of the semiconductor device obtained tends to be impaired.

Figure 10A:
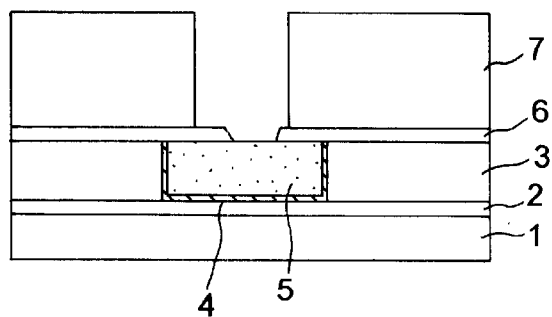
FIGS. 10A to 10D show sectional views for explaining the steps for forming a through hole.

After the completion of the etching, oxygen plasma ashing is conducted to remove part of the resist film 8. Then, a peeling treatment is conducted using the stripper composition containing the anticorrosive agent of the present invention. By this peeling treatment are removed the resist film which cannot be sufficiently removed by the ashing and the residue 11 of etching. As mentioned previously, the copper film 5 is exposed in at least some through holes, after the etching; therefore, the stripper composition needs to have corrosion inhibitability for copper. By using the stripper composition containing the present anticorrosive agent, the resist film and the etching residue 11 can be removed effectively without damaging the copper film 5. A state after the peeling treatment is shown in FIG. 10(a).

Figure 10B:
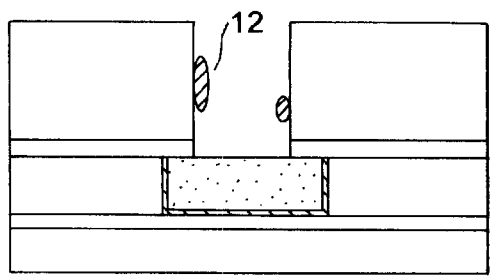
Figure 10C:
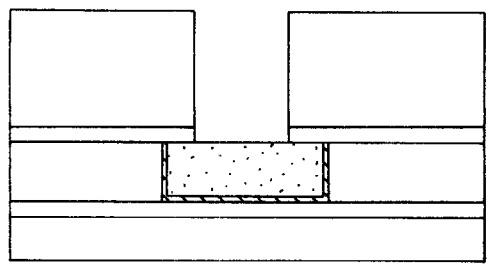

Then, a different etching gas is used and etching of the silicon nitride film 6 is conducted. At this time, an etching residue 12 sticks to the inner wall of the through hole 10 [FIG. 10(b)]. In order to peel and remove the etching residue 12, a peeling treatment is conducted again using the above-mentioned stripper composition. At the stage of this peeling treatment, the copper film 5 is exposed at the bottom of the through hole 10; however, by using the stripper composition containing the anticorrosive agent of the present invention, the etching residue 12 can be removed without damaging the copper film 5 [FIG. 10(c)].

Figure 10D:
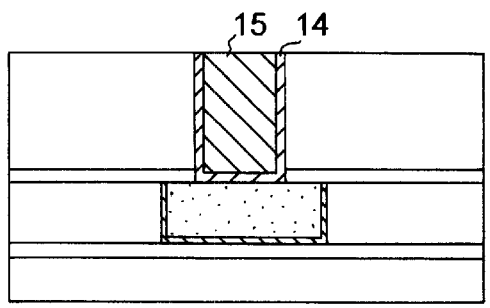

Then, a barrier metal film 14 (which is a laminate of Ti and TiN in this order) and a tungsten film 15 are formed inside the through hole; thereafter, leveling is made by CMP; thereby, an interconnection plug can be formed [FIG. 10(d)].

EXAMPLE 1

This is an example in which the anticorrosive agent of the present invention was applied to an corrosion inhibition treatment after CMP. The outline of the process conducted in this Example is explained below referring to FIG. 7 and FIG. 8.

Figure 7:
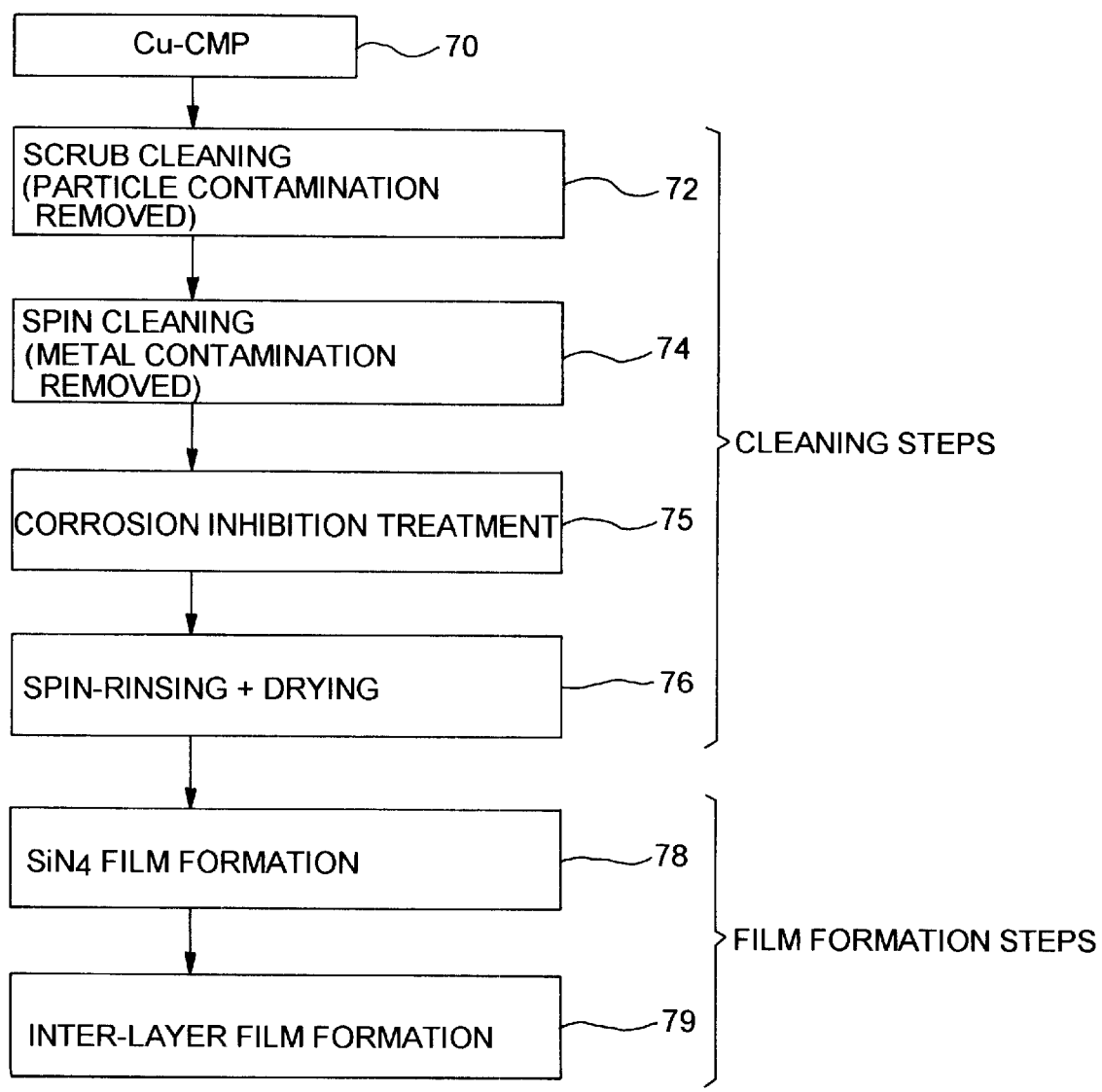
FIG. 7 is a drawing for explaining the steps employed in Example 1.
Figure 8A:
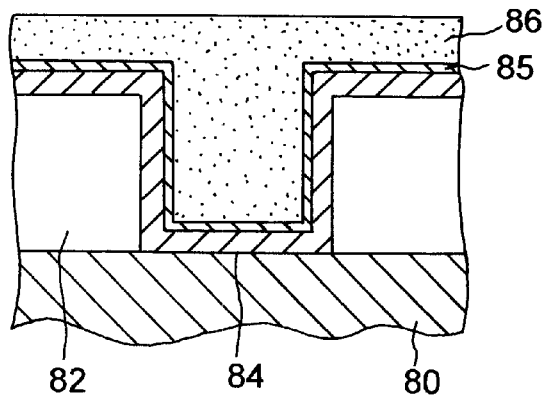
FIGS. 8A to 8C show sectional views for explaining the steps employed in Example 1.
Figure 8B:
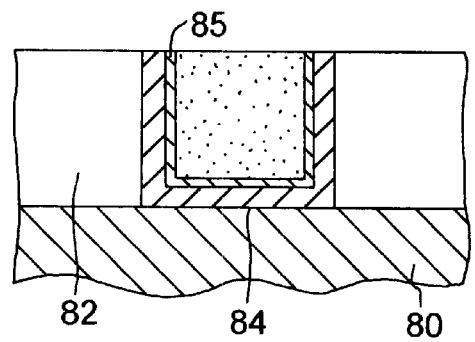

First, a Cu-CMP step 70 was conducted (FIG. 7). The condition corresponding to this step is shown in FIGS. 8(a)

and (b). At first, as shown in FIG. 8(a), a silicon nitride film 80 and a silicon oxide film 82 were formed in this order on a silicon wafer. Then, dry etching was conducted to form a plurality of wiring grooves having a desired pattern. Then, on the whole surface of the resulting material was formed a barrier metal film 84 consisting of TaN, by sputtering, after which seed Cu 85 and plating Cu 86 were formed. Successively, the wafer surface was polished by CMP to form copper wirings as shown in FIG. 8(b).

Next, the following steps were conducted in order to remove the particles (e.g. abrasive grains and polishing residue), metal and slurry sticking to the surface of the semiconductor wafer. First, a scrub-cleaning step 72 was conducted. That is, a rotating brush was moved while a cleaning solution consisting of electrolytic ionized water was sprayed on the brush, to remove particle contaminants. Then, a spin-cleaning step 74 was conducted. In this step, the semiconductor wafer was rotated for 10 seconds while a cleaning solution consisting of a 0.03 wt % aqueous oxalic acid solution was sprayed on the wafer, to remove the metal contaminant, i.e. CuO present on the wafer; then, pure water rinsing was conducted.

Next, a corrosion inhibition treatment step 75 was conducted. This step is not conducted in ordinary post-CMP treatments. In the present Example, an anticorrosive treating solution containing the anticorrosive agent of the present invention was used in this step. The anticorrosive treating solution had the following composition.

Urea: 0.05% by mass
Gallic acid: 0.01% by mass
Water: remainder

The anticorrosive treating solution was sprayed on the semiconductor wafer after the step 74 at a flow rate of 1 liter/min for 10 seconds while the wafer was rotated, to conduct the corrosion inhibition of the copper film.

Then, a spin-rinsing and drying step 76 was conducted. That is, pure water rinsing was conducted for 15 seconds, followed by drying.

Figure 8C:
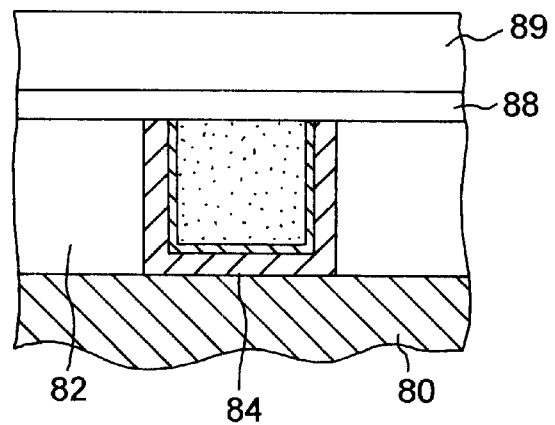

The above-obtained semiconductor wafer was allowed to stand in atmosphere for given days. Then, in a film formation step 78 of FIG. 7, a silicon nitride film 88 was formed as shown in FIG. 8(c). Thereon was formed a silicon oxide film 89. The silicon nitride film 88 was formed by CVD (400° C. and 10 to 15 seconds) and had a thickness of 50 nm. The silicon oxide film 89 was formed by plasma CVD (400° C. and 70 seconds) and had a thickness of 1.1 μm.

The above-obtained wafer was used as sample 1.

Samples 2 and 3 were produced in the same manner as above except that the anticorrosive treating solution was changed as shown in the following table.

TABLE 1

| Sample | Anticorrosive treating solution |
| --- | --- |
| Sample 1 | Urea: 0.05% by mass |
|  | Gallic acid: 0.01% by mass |
|  | Water: remainder |
| Sample 2 | Benztriazole: 0.1% by mass |
|  | Water: remainder |
| Sample 3 | Not used |

The samples 1 to 3 were tested for adhesivity of Cu/silicon nitride film interface in order to examine the degree of deterioration of copper surface. The test was conducted by applying cross-cut lines to the silicon nitride film at intervals of 1 mm so as to form 100 squares in the film, then attaching a pressure sensitive adhesive tape on the silicon nitride film, peeling the tape, and counting the number of the squares peeled together with the tape. A sample in which many squares are peeled and the adhesivity at Cu/silicon nitride film interface is inferior, is considered to have severe deterioration (e.g. oxidation) at the copper surface. This test was conducted for three cases of each sample, i.e. (i) a case in which a silicon nitride film was formed right after the spin-rinsing and drying step; (ii) a case in which the wafer after the spin-rinsing and drying step was allowed to stand in atmosphere for 1 day and then a silicon nitride film was formed, and (iii) a case in which the wafer after the spin-rinsing and drying step was allowed to stand in atmosphere for 3 days and then a silicon nitride film was formed. The test results are shown in Table 2.

TABLE 2

| | Time of wafer standing from spin-rinsing and drying to formation of silicon nitride film | | |
| --- | --- | --- | --- |
| Sample | 0 day (right after rinsing) | 1 day | 3 days |
| Sample 1 | 0 | 1 | 2 |
| Sample 2 | 2 | 3 | 4 |
| Sample 3 | 55 | — | — |

It was confirmed from the above test results that by using the anticorrosive agent of the present invention, the corrosion on Cu surface is suppressed effectively and the adhesivity at Cu/silicon nitride film interface is improved.

EXAMPLE 2

This is an example in which the present invention was applied to a process for forming copper wirings on a silicon wafer. The procedure by which the wafer was treated, is explained with reference to FIG. 1.

First, as shown in FIG. 1(a), on a silicon wafer (not shown) were formed a silicon oxide film 1 (thickness: 600 nm), a silicon nitride film 2 (thickness: 100 nm) and a silicon oxide film 3 (thickness: 1,000 nm) in this order; then, dry etching was conducted to form a plurality of wiring grooves having a desired pattern. Next, as shown in FIG. 1(b), on the whole surface of the resulting material was formed a barrier metal film 4 in a thickness of 20 nm, by sputtering. Thereon was formed, by sputtering, a seed metal film consisting of copper, necessary for growth of copper plating, after which a copper film 5 was formed by electrolytic plating. The thickness of the copper film 5 was about 900 nm at the flat portion [FIG. 1(b)]. Annealing was conducted at 300° C. for about 30 minutes. Then, CMP was conducted using a polishing apparatus similar to that shown in FIG. 2. The CMP slurry used was a commercial slurry for metal polishing containing no anticorrosive agent.

When polishing was conducted for a certain period of time, the rotational torque of CMP increased. At that time, the sectional structure of the wafer is such as shown in FIG. 1(c), that is, the copper plating film 5 on the flat portion of the insulating film is removed and thereby the barrier metal film 4 is exposed. This is because the TaN constituting the barrier metal film 4 is harder than the copper constituting the copper plating film 5 and is more resistant to CMP. At the timing when the rotational torque increased, the CMP slurry was changed to a slurry containing gallic acid (0.1% by mass), urea (0.4% by mass), silica (as an abrasive), hydrogen peroxide (as an oxidizing agent) and water (as a dispersing agent); and CMP was continued.

CMP was completed when the barrier metal film 4 was removed and there was a change in torque. After CMP, a post-cleaning was conducted. Then, pure water rinsing was conducted to obtain a wafer for evaluation. The wafer obtained was slight in generated dishing or erosion, and had no slit.

EXAMPLE 3

Test compounds shown in Table 3 were measured for biodegradability according to the OECD method [described in pp. 230 to 232 of "Experimental Method by Environmental Microorganisms (Kodansha Scientific (1988) edited by Ryuichi Sudo)]. That is, each test compound was added to a liquid culture medium containing a particular microorganism, and the mixture was stored at 25° C. and measured for the decomposition percent of the test compound at the initial day and after 7, 14, 21 or 28 days. The decomposition percent of each test compound after 28 days was rated according to the following standard.

⊚: Biodegradability is 80% or more.
○: Biodegradability is 30% to less than 80%.
Δ: Biodegradability is 5% to less than 30%.
x: Biodegradability is less than 5%.

The results of rating are shown in Table 3.

TABLE 3

| Test compound | Biodegradability |
| --- | --- |
| Urea | ⊚ |
| Pyrogallol | ○ |
| Gallic acid | ○ |
| Benztriazole | x |

EXAMPLE 4

This is an example in which a stripper composition containing the anticorrosive agent of the present invention was applied to a process for forming through holes on copper wirings.

Samples were produced by carrying out the same process as shown in FIG. 1 to FIG. 2(c). The procedure used for sample production is explained below.

First, copper wirings were formed on a silicon wafer. Thereon were formed a silicon nitride film (thickness; 90 nm) and a silicon oxide film (thickness: 900 nm), each by plasma CVD. Then, a positive resist film was formed by spinner coating. As the material for the resist film, there was used PEX4 (a product of Tokyo Ohka Kogyo Co., Ltd.) which was a positive resist material for KrF. The resist film was exposed to a light via a mask pattern, followed by development with an aqueous tetramethylammonium hydroxide solution, to obtain a resist pattern.

Using this resist patter as a mask, the silicon oxide film was dry-etched until the silicon nitride film was exposed, to form through holes having a diameter of 0.2 μm. As the etching gas, a fluorocarbon type gas was used. After the completion of the etching, oxygen plasma ashing was conducted to remove part of the resist pattern. Thereafter, a peeling treatment was conducted using a stripper composition shown in No. 1 of Table 4.

Next, the silicon nitride film was etched using a different etching gas, to expose each copper wiring at the bottom of each through hole. In order to remove the etching residue generated in the above etching, a peeling treatment was conducted again using the same stripper composition (No. 1 in Table 4) as used above.

The same procedure as above was conducted using each of stripper solutions Nos. 2 to 8 shown in Table 4, to produce total 8 kinds of samples.

Each sample (wafer) obtained above was rinsed with pure water, and its section was observed by a scanning electron microscope (SEM) to examine (1) stripping ability of resist film and etching residue and (2) corrosion inhibitability for copper film. The following rating standards were used.

Stripping Ability

The degree of remaining of resist film and etching residue was examined visually and rated by the following three grades.

○: Substantially no remaining
Δ: Remaining in a small amount
x: Remaining in a large amount Corrosion Inhibitability The corrosion status of copper film surface was examined visually and rated by the following four grades.

⊚: Copper film had no corrosion.
○: Copper film had slight corrosion.
Δ: Copper film had corrosion.
x: Copper film had striking corrosion.

TABLE 4

| No. of Stripper composition | Formulation of stripper composition | | | Rating | |
| --- | --- | --- | --- | --- | --- |
| | Anticorrosive agent (mass %) | Peeling agent (mass %) | Water | Stripping ability | Corrosion inhibit-ability |
| 1 | Gallic acid (5) Urea (5) | NMEA (60) | Remainder | ○ | ○ |
| 2 | Gallic acid (5) Urea (25) | NMEA (60) | Remainder | ○ | ⊚ |
| 3 | Pyrogallol (5) Urea (25) | NMEA (60) | Remainder | ○ | ⊚ |
| 4 | Gallic acid (5) Urea (25) | MEA (60) | Remainder | ○ | ⊚ |
| 5 | Catechol (5) Urea (25) | NMEA (60) | Remainder | ○ | ○ |

TABLE 4-continued

| No. of Stripper composition | Formulation of stripper composition | | | Rating | |
|---|---|---|---|---|---|
| | Anticorrosive agent (mass %) | Peeling agent (mass %) | Water | Stripping ability | Corrosion inhibit-ability |
| 6 | Urea (25) | NMEA (60) | Remainder | ○ | x |
| 7 | Gallic acid (5) | NMEA (60) | Remainder | ○ | x |
| 8 | Sorbitol (5) Urea (25) | NMEA (60) | Remainder | ○ | x |

*1 In the column of water, "remainder" refers to a remainder after the amounts of anticorrosive agent and peeling agent have been subtracted from 100% by mass.
*2 NMEA: N-methylethanolamine
MEA: monoethanolamine As is clear from the above, each stripper composition using an anticorrosive agent of the present invention has excellent stripping ability and corrosion inhibitability. In the present example, the present invention was applied to a single damascene process; however, the present invention can also be applied to a dual damascene process.

EXAMPLE 5

A silicon wafer having a copper film on the whole surface was immersed in various given stripper solutions at 80° C. for 10 minutes. The etching rate of copper in each solution was measured for the thicknesses of the copper films before and after immersion. The results are shown in FIG. 11 and FIG. 12.

Figure 11:
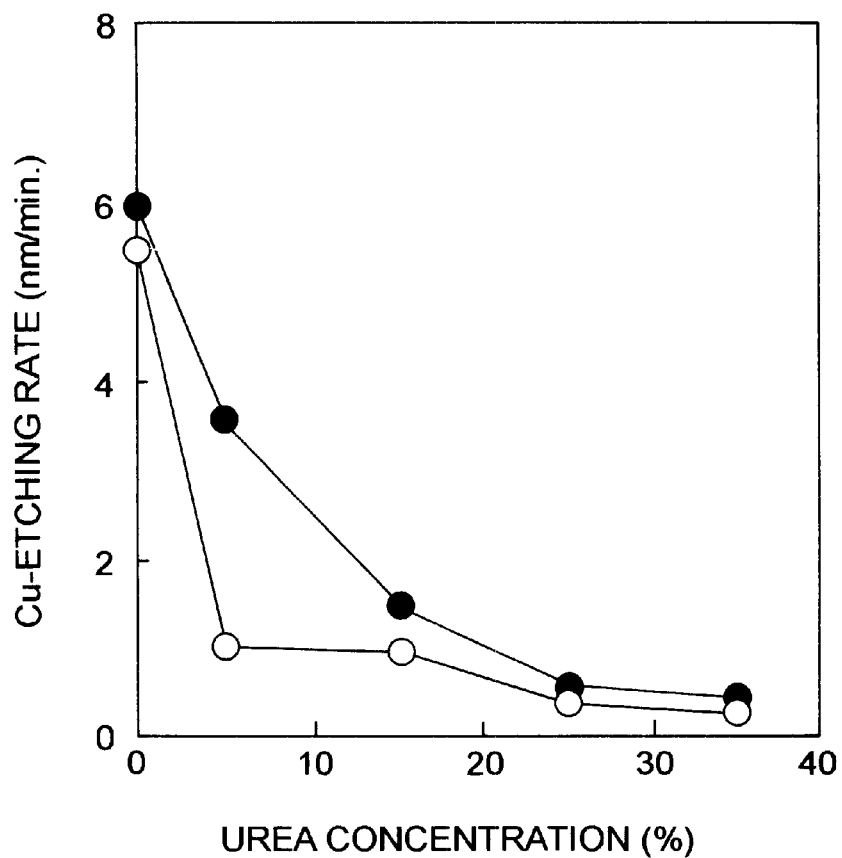
FIG. 11 is a graph showing the effect of urea concentration on the etching rate of copper film.

The stripper solutions in FIG. 11 had the following compositions.

Figure 12:
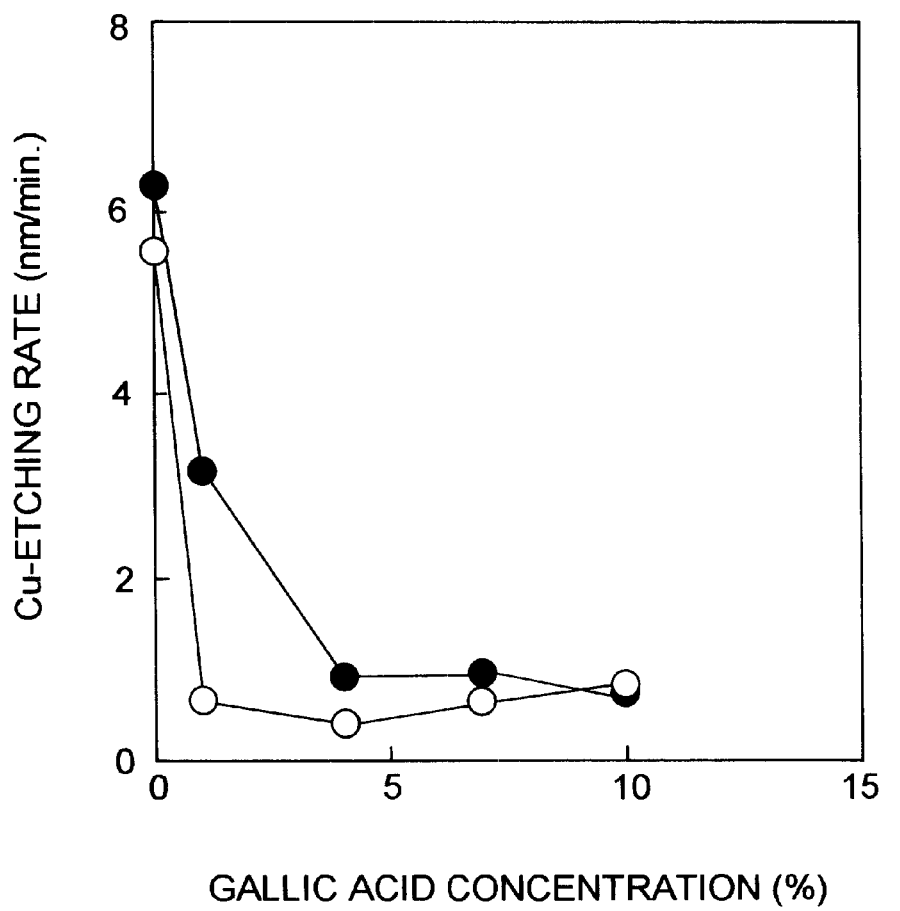
FIG. 12 is a graph showing the effect of gallic acid concentration on the etching rate of copper film.

Amine: 60% by mass
Gallic acid: 5% by mass
Urea: 0, 5, 15, 25 or 35% by mass
Water: remainder The stripper solutions in FIG. 12 had the following compositions. Incidentally, ammonia water was added in order to remove the factor of pH variation caused by the difference in addition amount of gallic acid, whereby the pH of each stripper solution was controlled to 11.

Amine: 60% by mass
Gallic acid: 0, 1, 4, 7 or 10% by mass
Urea: 10% by mass
Water: remainder As the amine, there was used NMEA (N-methylethanolamine) or MEA (monoethanolamine).

When the etching rate shown by the ordinate of FIGS. 11 or 12 exceeded 4 nm/min, the corrosion of copper film became striking. As is clear from FIGS. 11 and 12, combined use of urea and gallic acid shows excellent corrosion inhibitability.

As described above, since the anticorrosive agent of the present invention contains particular components, the agent can effectively prevent corrodible metals (e.g. copper) from being corroded, and is biodegradable (this allows easy disposal of the waste liquid generated). Therefore, the present anticorrosive agent is preferably applicable to the corrosion inhibition of corrodible metals, particularly to a process for production of semiconductor device containing metal wirings, for example, CMP, post-CMP treatments and resist-peeling.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention, The entire disclosure of Japanese Patent Application No.2000-15602 including specification, claims, drawings and summary are incorporated herein by reference in its entirely.

What is claimed is:

1. A slurry for chemical mechanical polishing of the surface of a semiconductor wafer having an exposed surface of a metal film, which contains an anticorrosive agent containing as essential components (a) urea or an urea derivative and (b) a hydroxy aromatic compound, wherein component (b) is 1 to 200% by mass of component (a).

2. A slurry according to claim 1, wherein component (a) is a compound represented by the following general formula (1):

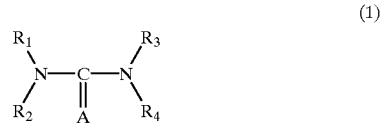

wherein $R_1$, $R_2$, $R_3$ and $R_4$ are each independently a hydrogen atom or an alkyl group having 1 to 3 carbon atoms; and A is an oxygen atom or a sulfur atom.

3. A slurry according to claim 1, wherein component (b) is a benzene derivative having in its molecule at least two phenolic hydroxyl groups.

4. A slurry according to claim 3, wherein component (b) is at least one compound selected from the group consisting of pyrogallol, hydroxyhydroquinone, fluoroglucinaol, gallic acid and tannic acid.

5. A slurry according to claim 1, in water or an organic solvent carrier.

* * * * *